United States Patent
Bertolasi et al.

(10) Patent No.: US 10,241,152 B2
(45) Date of Patent: Mar. 26, 2019

(54) AUTOMATED MOTOR ADAPTATION

(71) Applicant: Danfoss Power Electronics A/S, Grasten (DK)

(72) Inventors: Mark A. Bertolasi, Belvidere, IL (US); Michael Harke, Sun Prairie, WI (US); Charles J. Romenesko, Loves Park, IL (US); Shaohua Suo, Machesney Park, IL (US)

(73) Assignee: Danfoss Power Electronics A/S, Grasten (DK)

( * ) Notice: Subject to any disclaimer, the term of this patent is extended or adjusted under 35 U.S.C. 154(b) by 232 days.

(21) Appl. No.: 14/908,170

(22) PCT Filed: Jul. 9, 2014

(86) PCT No.: PCT/IB2014/062961
§ 371 (c)(1),
(2) Date: Jan. 28, 2016

(87) PCT Pub. No.: WO2015/015342
PCT Pub. Date: Feb. 5, 2015

(65) Prior Publication Data
US 2016/0169974 A1 Jun. 16, 2016

Related U.S. Application Data

(60) Provisional application No. 61/861,724, filed on Aug. 2, 2013.

(51) Int. Cl.
*G01R 31/34* (2006.01)

(52) U.S. Cl.
CPC .................................. *G01R 31/34* (2013.01)

(58) Field of Classification Search
None
See application file for complete search history.

(56) References Cited

U.S. PATENT DOCUMENTS

| 4,099,107 A | 7/1978 | Eder |
| 5,477,162 A | 12/1995 | Heikkila |

(Continued)

FOREIGN PATENT DOCUMENTS

| CN | 1222006 A | 7/1999 |
| CN | 101944877 A | 1/2011 |

(Continued)

OTHER PUBLICATIONS

"Identification of induction motor equivalent circuit parameters using the single-phase test", Gastli, IEEE Transactions on Energy Conversion, IEEE Service Center, Piscataway, NJ, US, vol. 14, No. 1,Mar. 1, 1999 (Mar. 1, 1999), pp. 51-56, XP000891114, ISSN: 0885-8969, DOI: 10.1109/60.749147.*

(Continued)

*Primary Examiner* — James G Norman
(74) *Attorney, Agent, or Firm* — McCormick, Paulding & Huber LLP

(57) ABSTRACT

A method of determining electromagnetic characteristics of an asynchronous motor system is described. A motor system model is presented including a stator resistance, a transient inductance, a magnetizing inductance and a rotor resistance. A DC sequence is used to determine the stator resistance, a voltage pulse is used to determine the transient inductance, a binary injection frequency search algorithm is used to determine the magnetizing inductance, and an AC sine wave at slip frequency with DC offset is used to determine the rotor resistance.

22 Claims, 7 Drawing Sheets

(56) References Cited

U.S. PATENT DOCUMENTS

| | | | |
|---|---|---|---|
| 5,689,169 A * | 11/1997 | Kerkman | H02P 21/16 |
| | | | 318/772 |
| 5,861,728 A | 1/1999 | Tazawa et al. | |
| 6,008,618 A | 12/1999 | Bose et al. | |
| 6,069,467 A | 5/2000 | Jansen | |
| 6,179,105 B1 | 1/2001 | Haass | |
| 6,246,192 B1 | 6/2001 | Haass | |
| 6,636,012 B2 | 10/2003 | Royak et al. | |
| 6,664,755 B1 | 12/2003 | Huang | |
| 6,774,664 B2 | 8/2004 | Godbersen | |
| 6,862,538 B2 | 3/2005 | El-Ibiary | |
| 7,135,830 B2 | 11/2006 | El-Ibiary | |
| 7,164,246 B2 | 1/2007 | Fitzgibbon et al. | |
| 7,184,902 B2 | 2/2007 | El-Ibiary | |
| 7,570,074 B2 | 8/2009 | Gao et al. | |
| 7,769,552 B2 | 8/2010 | Colby et al. | |
| 8,102,140 B2 | 1/2012 | Gao et al. | |
| 2002/0158658 A1 | 10/2002 | Godbersen | |
| 2003/0062870 A1 | 4/2003 | Royak et al. | |
| 2004/0017118 A1 | 1/2004 | El-Ibiary | |
| 2004/0019439 A1 | 1/2004 | El-Ibiary | |
| 2005/0067991 A1 | 3/2005 | El-Ibiary | |
| 2005/0067992 A1 | 3/2005 | El-Ibiary et al. | |
| 2005/0071095 A1 | 3/2005 | El-Ibiary | |
| 2006/0250154 A1 | 11/2006 | Gao et al. | |
| 2007/0118307 A1 | 5/2007 | El-Ibiary | |
| 2007/0118308 A1 | 5/2007 | El-Ibiary | |
| 2009/0051308 A1 | 2/2009 | Lu et al. | |
| 2009/0284204 A1 | 11/2009 | Colby et al. | |
| 2009/0284211 A1 | 11/2009 | Gao et al. | |
| 2010/0194329 A1 | 8/2010 | Lu et al. | |
| 2010/0201396 A1 | 8/2010 | Cop | |
| 2012/0038303 A1 | 2/2012 | Villwock et al. | |
| 2013/0096865 A1 | 4/2013 | Gao et al. | |
| 2014/0145541 A1 | 5/2014 | Jalebi et al. | |
| 2014/0163912 A1 | 6/2014 | Gao et al. | |
| 2014/0167674 A1 | 6/2014 | Wang et al. | |
| 2014/0184135 A1 | 7/2014 | Bazzi et al. | |

FOREIGN PATENT DOCUMENTS

| | | |
|---|---|---|
| CN | 101944878 A | 1/2011 |
| CN | 102291080 A | 12/2011 |
| CN | 103064021 A | 4/2013 |
| DE | 19836237 C1 | 3/2000 |
| DE | 102009011674 A1 | 9/2010 |
| EP | 0704709 A | 4/1996 |
| EP | 2270523 A1 | 1/2011 |
| FI | 920090 | 1/1992 |
| FI | 915051 A | 4/1993 |
| JP | 06324127 A | 11/1994 |
| JP | 07075399 A | 3/1995 |
| WO | 2014024059 A2 | 2/2014 |

OTHER PUBLICATIONS

Schierling H: "Self-Commissioning—A Novel Feature of Modern Inverter-Fed Induction Motor Drives", May 1, 1999, vol. 140, No. 3, May 1, 1999 (May 1, 1999), pp. 287-290, XP006518639.*

Schierling H: "Self-Commissioning—A Novel Feature of Modern Inverter-Fed Induction Motor Drives", May 1, 1993, vol. 140, No. 3, May 1, 1993 (May 1, 1993), pp. 287-290, XP006518639. (Provided in the IDS dated Mar. 3, 2016) (Year: 1993).*

Schierling H: "Self-Commissioning—A Novel Feature of Modern Inverter-Fed Induction Motor Drives", May 1, 1993, vol. 140, No. 3, May 1, 1993 (May 1, 1993), pp. 287-290, XP006518639. (Provided in the IDS dated Mar. 3, 2016) Year: 1993).*

Prof. Dr. H. Bulent Ertan et al. "A Novel Approach to Detection of Some Parameters of Induction Motors" Ankara, Turkey. 2007. pp. 1626-1631.

A. Stankovic et al. "A Novel Method for Measuring Induction Machine Magnetizing Inductance" Department of Electrical and Computer Engineering. Madison, Wisconsin. 1997. pp. 234-238.

A. Gastli. "Identification of Induction Motor Equivalent Circuit Parameters Using the Single-Phase Test" IEEE Transactions on Energy Conversion, vol. 14, No. 1, Mar. 1999. pp. 51-56.

Martin Jadric et al. "Identification of Rotor Resistance and Transient Inductance of Induction Motors Using Frequency Selection Criterion" 2012. pp. 980-986.

T. Kataoka et al. "On-Line Estimation of Induction Motor Parameters by Extended Kalman Filter" Tokyo Institute of Technology, Japan. Sep. 13, 1993. pp. 325-329.

Myoung-Ho Shin et al. "Online Identification of Stator Transient Inductance in Rotor-Flux-Oriented Induction Motor Drive" IEEE Transactions on Industrial Electronics, vol. 54, No. 4. Aug. 2007. pp. 2018-2023.

H. Schierling. "Self-Commissioning—A Novel Feature of Modern Inverter-Fed Induction Motor Drives" Germany. pp. 287-290.

Ashwin M. Khambadkone et al. "Vector-Controlled Induction Motor Drive with a Self-Commissioning Scheme" IEEE Transactions on Industrial Electronics, vol. 38, No. 5. Oct. 1991. pp. 322-327.

* cited by examiner

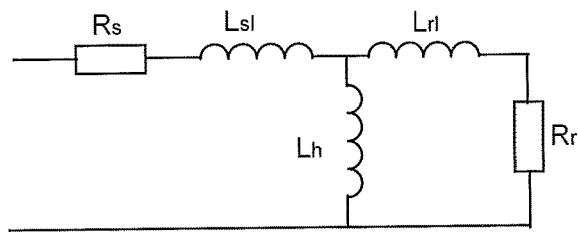
30   Fig. 3
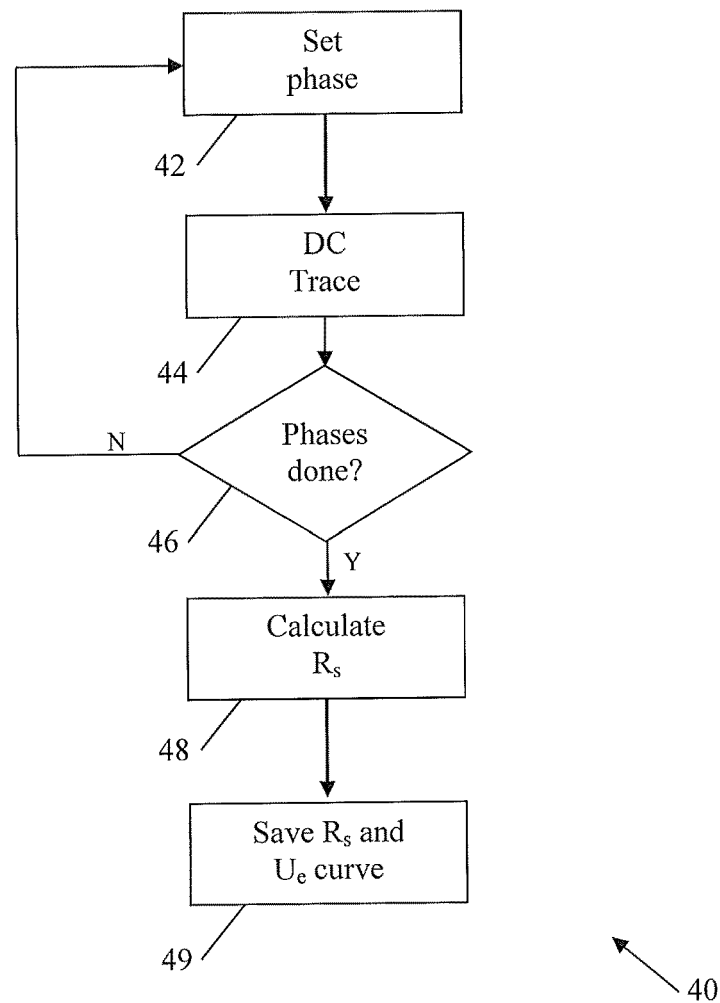
Fig. 4

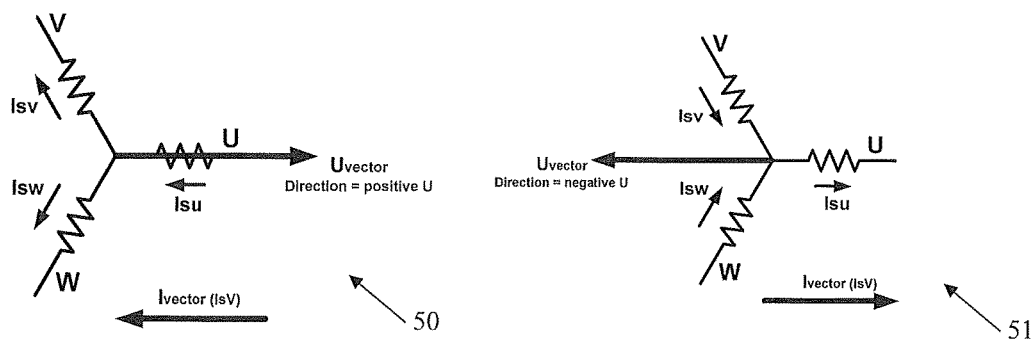
Fig. 5
Fig. 6
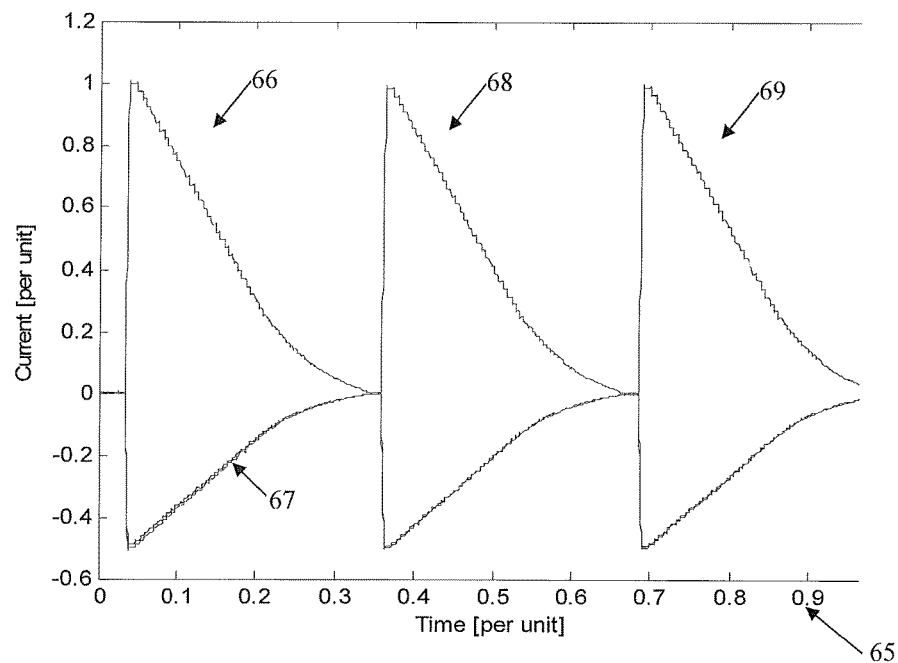
Fig. 7

AUTOMATED MOTOR ADAPTATION

CROSS-REFERENCE TO RELATED APPLICATIONS

This application is entitled to the benefit of and incorporates by reference subject matter disclosed in the International Patent Application No. PCT/IB2014/062961 filed on Jul. 9, 2014 and U.S. Provisional Patent Application No. 61/861,724 filed on Aug. 2, 2013.

TECHNICAL FIELD

The present invention relates to a mechanism for determining the electromagnetic characteristics of an asynchronous motor.

BACKGROUND

FIG. 1 is a highly schematic block diagram, indicated generally by the reference numeral 1, of a known motor system. The motor system 1 comprises an AC power source 2, a rectifier 4, a DC link capacitor 6, an inverter module 8, a three-phase motor 10 and a controller 12.

As is well known in the art, the rectifier 4 converts AC electrical power provided by the AC power source 2 into a DC source at the DC link capacitor 6. The inverter module 8 comprises a number of switching elements, typically insulated gate bipolar transistors (IGBTs), that are used to convert the DC signal at the DC link capacitor 6 into three AC signals that are provided to each of the phases of the motor 10. The controller 12 provides switching instructions for each of the switching elements of the inverter module 8. Thus, the controller 12 is able to precisely control the frequency and phase of each of the signals provided to the motor 10.

The controller 12 may, for example, be used to control the motor 10 in order to provide a desired speed and/or torque. In order to enable accurate control, it is necessary for the controller 12 to take into account the electromagnetic properties of the motor 10.

One method is to use data sheet information relating to the motor 10. However, even when this information is available, it is often insufficiently precise and accurate to enable accurate and efficient control of the motor 10.

An alternative to using data sheet information is to measure the characteristics of the motor itself. For example, it is known to use the controller 12 to control the injection of signals into the motor 10, to monitor the response to those signals and to estimate various resistances and inductances of the motor 10 on the basis of those responses.

In some cases, it is desirable to inject large currents into the motor to mitigate nonlinearities caused by the inverter or to explore other nonlinearities such as magnetic saturation. Injecting large currents into a motor can cause significant heat generation and can cause damage to the motor and/or the inverter. Further, some existing methods for obtaining data regarding the characteristics of the motor 10 are slow.

Many existing methods require the motor 10 to rotate in order to determine the electrical and magnetic properties of the motor. With the motor 10 installed within a system, this may often be undesirable. It would therefore be advantageous in some circumstances to enable such data to be obtained with the motor at standstill.

The present invention seeks to address at least some of the problems outlined above.

SUMMARY

The present invention provides a method of determining electromagnetic characteristics of an asynchronous motor system, wherein the electromagnetic characteristics include a transient inductance, the method comprising: applying a voltage pulse to the motor system; taking a plurality of samples of a rising portion of a current pulse generated in response to the voltage pulse; and using a non-linear curve fitting algorithm to determine the transient inductance of the motor system from said samples.

In one form of the invention, the current pulse is approximated by the equation $$\frac{V}{R}(1 - e^{\frac{-t_0}{\tau}}),$$

wherein $$\tau = \frac{L}{R}.$$

In that formula, L may be the said transient inductance. In that formula, R may be the sum of the stator and rotor resistances of the motor system.

The curve fitting algorithm may be implemented using a Levenberg-Marquardt algorithm. Other suitable algorithms will be know to persons skilled in the art.

In some forms of the invention, the transient inductance is estimated at a plurality of different DC offset voltages.

The said electromagnetic characteristics may further comprise a magnetizing inductance. The method of the invention may further comprise: injecting a signal into the motor at a first frequency; determining the magnetizing inductance and flux in the motor at the first frequency; comparing the flux at the first frequency with an expected flux; adjusting the frequency of the injected current in the event that the flux is not sufficiently close to the expected flux; and using the magnetizing inductance measured when the flux is sufficiently close to the expected flux as the magnetizing inductance of the motor system. As described in detail below, the magnetizing inductance is determined on the basis of a vector diagram.

The present invention also provides a method of determining electromagnetic characteristics of an asynchronous motor system, wherein the electromagnetic characteristics include a magnetizing inductance, the method comprising: injecting a signal into the motor at a first frequency; determining the magnetizing inductance and flux in the motor at the first frequency; comparing the flux at the first frequency with an expected flux; adjusting the frequency of the injected current in the event that the flux is not sufficiently close to the expected flux; and using the magnetizing inductance measured when the flux is sufficiently close to the expected flux as the magnetizing inductance of the motor system. As described in detail below, the magnetizing inductance is determined on the basis of a vector diagram.

In forms of the invention in which the magnetizing inductance is determined, the invention may include determining the voltage drop across the magnetizing inductance by subtracting both the voltage drop across the stator resistance (given by $R_s I_s$) and the voltage across the transient inductance (given by $j\sigma X_s i_s$) from the stator voltage. The stator voltage may be measured. The said voltages are typically represented as vectors: this makes it possible to take phase differences between different voltages into account when summing or subtracting voltages.

Determining the magnetizing inductance may include determining the current flowing through the magnetizing inductance on the basis of the stator current (which may be measured) and on the basis that the magnetizing current is at right angles to the voltage across the magnetizing inductance.

Thus, in one form of the invention, measurements are taken of the stator voltage $u_s$ and the stator current $i_s$. The stator resistance $R_s$ (typically determined as part of a DC sequence) is used to determine the voltage drop across the stator resistance (generally given by $R_s I_s$) and the voltage across the transient inductance (typically determined as part of a transient inductance step) is also determined (generally given by $j\sigma X_s i_s$). This information, together with knowledge of the phase angle between the stator currents and voltages is sufficient to determine all of the currents and voltages in the equivalent circuit of the motor system, from which the magnetizing inductance can readily be determined.

In the algorithm set out above for determining the magnetizing inductance, the expected flux may be calculated based on the known or estimated electromagnetic characteristics of the motor system.

In the algorithm set out above for determining the magnetizing inductance, the frequency of the injected current may be adjusted using a search algorithm, typically a binary search algorithm.

In many forms of the invention, the electromagnetic characteristics of the asynchronous motor system further comprise a stator resistance of the motor and/or non-linearity of an inverter used to drive the motor. The invention may further comprising applying a first DC sequence to a first phase of the motor system, the first DC sequence comprising: setting a first DC current level for application to the motor system and measuring the current(s) and/or the voltage(s) applied to the motor system in response to the setting of the first DC current level; adjusting the applied DC current level and measuring the current(s) and/or voltage(s) applied to the motor in response to the adjusted DC current level; and repeating the adjusting and measuring step until the first DC sequence is complete.

The DC sequence may further comprise applying a second DC sequence to a second phase of the motor system, the second DC sequence comprising: setting a first DC current level for application to the motor system and measuring the current(s) and/or the voltage(s) applied to the motor system in response to the setting of the first DC current level; adjusting the applied DC current level and measuring the current(s) and/or voltage(s) applied to the motor in response to the adjusted DC current level; and repeating the adjusting and measuring step until the second DC sequence is complete.

More DC sequences may be applied to more phases of the motor. The phases of the motor system may be selected from: a positive U vector, a negative U vector, a positive V vector, a negative V vector, a positive W vector and a negative W vector.

In some forms of the invention, for each DC current level applied during one of the DC sequences, the motor is given time to settle before the voltage and/or current measurements are taken. Furthermore, the currents applied to the motor may be monitored to determine when the applied DC current level has settled.

In one form of the invention, the DC sequences are applied such that any torque created within the motor system is minimized. Similarly, other sequences may be applied such that any torque created within the motor system is minimized.

The invention may further comprise using data obtained from the application of the DC sequence to determine stator resistance of the motor and/or non-linearity of an inverter used to drive the motor.

The electromagnetic characteristics may further comprise a rotor resistance, wherein the voltage across the rotor resistance is equal to the voltage across the magnetising inductance, wherein the rotor resistance is determined by dividing the voltage across the rotor resistance by the current through the rotor resistance. The current through the rotor resistance may calculated from the stator current (which may be measured) and the current through the magnetising inductance.

The method may further comprise injected an AC signal at a slip frequency of the motor under test (with a DC offset) in order to determine a rotor resistance of the motor system.

BRIEF DESCRIPTION OF THE DRAWINGS

The invention will now be described in further detail with reference to the following schematic drawings, in which:

FIG. 3 is an electrical equivalent circuit of an asynchronous motor;

FIG. 4 is a flow chart of a DC sequence in accordance with an aspect of the present invention;

FIG. 5 is a vector diagram of a three-phase asynchronous motor;

FIG. 6 is a vector diagram of a three-phase asynchronous motor;

FIG. 7 shows a plot of applied currents of an exemplary DC sequence;

DETAILED DESCRIPTION

Figure 1:
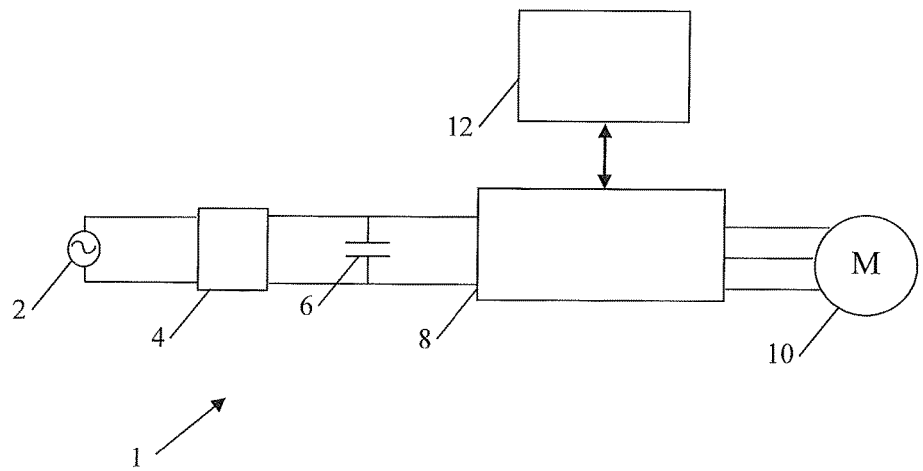
FIG. 1 is a block diagram of a known motor system.
Figure 2:
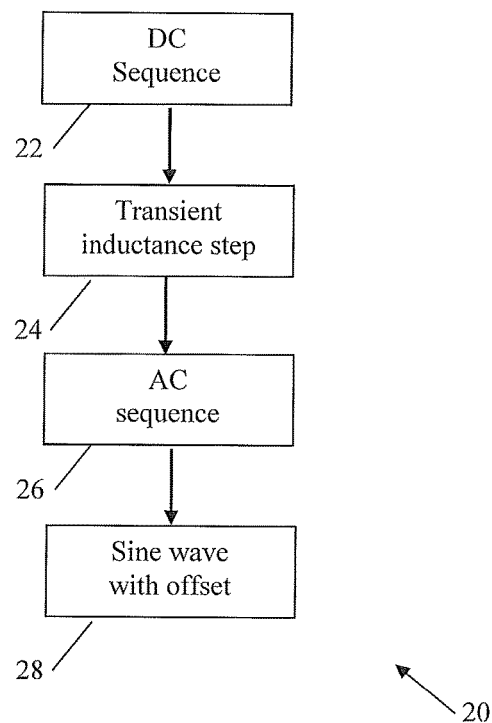
FIG. 2 is a flow chart of an algorithm in accordance with an aspect of the present invention.

FIG. 2 is a flow chart of an algorithm, indicated generally by the reference numeral 20, in accordance with an aspect of the present invention.

The algorithm 20 starts at step 22, where a DC sequence is performed. As described in detail below, the DC sequence is used to measure the non-linearity of the inverter 8 and to measure the equivalent stator resistance $R_s$ of the motor 10, which may include resistive effects in the inverter and in cabling.

Next, the algorithm moves to step 24, where a voltage pulse is applied to determine the transient inductance $L_\sigma$ of the motor.

Next, the algorithm moves to step 26, where an AC sequence is applied to determine the magnetizing inductance $L_h'$ of the motor under test.

Finally, the algorithm moves to step 28, where an AC sine wave with DC offset is applied to determine the rotor resistance $R_r'$ of the motor under test.

These steps are discussed in detail below. It should be noted that some of the steps of the algorithm could be implemented in a different order. Further, in some forms of the invention, one or more of the steps may be omitted (for example, if the data determined by that step of the algorithm is already known or is not required).

FIG. 3 is an electrical equivalent circuit of an asynchronous motor, such as the motor 10 described above, when the motor is at standstill. The equivalent circuit, indicated generally by the reference numeral 30, includes a stator resistance $R_s$, a stator leakage inductance $L_{sl}$, a mutual inductance $L_h$, a rotor leakage inductance $L_{rl}$ and a rotor resistance $R_r$. The rotor inductance $L_r$ and the stator inductance $L_s$ are readily calculated as follows: $L_r=L_h+L_{rl}$; and $L_s=L_h+L_{sl}$.

Figure 11:
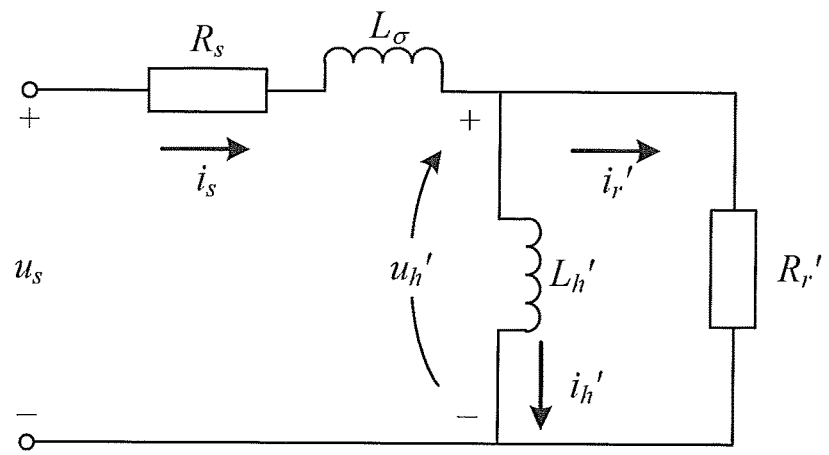
FIG. 11 is an alternative electrical equivalent circuit of an asynchronous motor.

FIG. 11 shows an alternative equivalent circuit, indicated generally by the reference numeral 100, for an asynchronous motor. The circuit 100, which is mathematically the same as the equivalent circuit 30 described above with reference to FIG. 3, comprises a stator resistance $R_s$, transient inductance $L\sigma$, main inductance $L_h'$ (often referred to below as a magnetizing inductance) and rotor resistance $R_r'$.

Where:

$$Rs = Rs$$

$$L\sigma = Ls - \frac{Lh^2}{Lr} \approx Lsl + Lrl$$

$$Lh' = \frac{Lh^2}{Lr}$$

$$Rr' = \frac{Lh^2}{Lr^2} \cdot Rr$$

As indicated above, the DC sequence 22 is used to measure the stator resistance $R_s$. A DC sequence is used since, at DC, the various inductances shown in the equivalent circuit 30 behave as short-circuits and so the electrical equivalent circuit 30 can be approximated to the stator resistance $R_s$. (Similarly, the inductances shown in the equivalent circuit 100 behave as short-circuits so that the electrical equivalent circuit 100 can also be approximated to the stator resistance $R_s$.) Details of an exemplary DC sequence are provided below. Further details can be found in the applicant's co-pending patent application PCT/IB2013/055692 filed on 11 Jul. 2013 (published as WO2014/024059).

FIG. 4 is a flow chart, indicated generally by the reference numeral 40, of a DC sequence in accordance with an aspect of the present invention.

The algorithm 40 starts at step 42 where it is determined which phase of the motor 10 is to be used to inject signals into the motor. The three phases (labelled u, v and w) of an exemplary motor are shown in FIGS. 5 and 6. (Note that although three-phase motors are described, the method is not limited to three phase machines, but can be applied to machines with more or fewer phases.)

As indicated above, it is desirable to keep the motor 10 at standstill. In order to do so, no net torque must be produced at the motor. This is achieved by keeping a voltage vector angle applied to the motor in one direction since a torque is generated when the voltage vector angle rotates.

As described in detail below, the voltage vector direction is changed during the measurement process but this is only done when the voltage vector magnitude is zero and after the motor has been demagnetised. (It may, for example, be assumed that the motor is sufficiently demagnetised after a zero voltage vector has been applied for a given time. The motor current may also be regulated to a zero command, in which case the voltage vector will adjust to drive the stator current to zero.)

FIG. 5 is a vector diagram of the three-phase asynchronous motor 10 with a positive U voltage vector applied. To apply a positive u-phase current vector ($I_{su}$), a positive U voltage vector is applied (indicating that a current flows into the motor through the u-phase connection). As shown in FIG. 5, if a current flows into the motor through the u-phase connection, then currents must flow out of the motor through the v- and w-phases of the motor (such that negative current vectors $I_{sv}$ and $I_{sw}$ are provided).

The phase setting step 42 of algorithm 40 can select one of six vector directions to be applied to the motor 10. The positive U vector shown in FIG. 5 is one option. A second option is a negative U vector as shown in FIG. 6. As shown in FIG. 6, a negative U vector causes current to flow into the motor 10 through the v- and w-phase connections (positive $I_{sv}$ and $I_{sw}$) and causes a current to flow out of the u-phase connection (negative $I_{su}$).

In addition to positive and negative U vectors, the step 42 can select a positive V vector, a negative V vector, a positive W vector and a negative W vector. The currents that flow in the motor 10 during the testing phase can be very large. In each test, all of the current flows through one of the phase connections of the motor and half of the current flows through each of the other two phase connections (for a three-phase motor). By changing which of the phase connection carries the entire test current, the heat generated in a particular phase of the inverter 8 and the motor 10 can be reduced over the entire sequence. This reduces the likelihood of the inverter 8 and/or the motor 10 being damaged during the test measurements and also reduces the impact of heat on the measurements obtained while allowing multiple measurements to be obtained so that an average estimate can be obtained.

With the phase set at step 42, the algorithm 40 moves to step 44 where a DC trace step is applied. The DC trace step 44 applies a number of differently sized vectors to the motor 10.

As described further in the co-pending application PCT/IB2013/055692 (published as WO2014/024059), the DC trace step 44 may include setting a current command (for example by defining the size of a current vector to be applied to a particular phase of the motor), waiting for the current vector to settle and measuring and recording the current magnitude and applied voltage measurements, before repeating for different DC trace levels.

At step 46 of the algorithm 40, it is determined whether any further phases of the motor are to have test vectors applied thereto. If so, the algorithm 40 returns to step 42 where a different phase is selected. The DC trace step 44 is then repeated for that phase and a further set of data is stored. If not, the algorithm 40 moves to step 48.

At step 48, the data collected at each instance of the DC trace step 44 is used to determine the stator resistance $R_s$ of the motor 10. Finally, at step 49, the $R_s$ and $U_e$ curves for the motor system are stored.

FIG. 7 shows a plot, indicated generally by the reference numeral 65, of applied currents of an exemplary DC sequence. The plot 65 shows the current in each of the three phases of the motor 10. A first pulse 66 is applied to the u-phase of the motor 10. The first pulse 66 is a positive U pulse, and smaller negative V and negative W pulses (indicated generally by the reference numeral 67) occur at the same time (so that the overall current applied to the motor sums to zero). A second pulse 68 is applied to the v-phase of the motor 10 and finally a third pulse 69 is applied to the w-phase of the motor.

Thus, the plot 65 shows an exemplary implementation of the algorithm 40. The algorithm 40 starts at step 42, where a phase of the motor is selected (initially phase u in the plot 65). Next, a DC trace is applied (step 44). The DC trace starts with a high current and the current is progressively reduced until it reaches zero.

As shown in FIG. 7, the pulse 66 comprises a number of steps. Each step of the pulse 66 corresponds to a current set during the DC trace process 44. Once the current has settled, current and voltage outputs of the inverter 8 are measured and stored and the current command adjusted.

Once the current is reduced to zero (so that the pulse 66 is complete), the current is kept at zero in all three phases of the motor for a short dwell time before the next pulse is applied. The provision of a dwell time ensures that magnetic flux in the motor reduces to zero before the next pulses are applied. If the dwell time is too short, then rotor flux will remain in the machine and the application of the next pulse would provide a stator flux that will interact with the rotor flux, resulting in torque production in the motor.

With the dwell time complete, the algorithm 40 moves to step 46, where it is determined that further phases need to be tested. The algorithm 40 then returns to step 42 where the v phase is selected. The pulse 68 is applied to the motor 10 in a similar manner to the pulse 66. Once the pulse 68 has been applied, the pulse 69 is applied. Once the pulse 69 is applied, the algorithm 40 moves to steps 48 and 49 where the stator resistance $R_s$ and the $U_e$ curve data are determined and stored (as described further below).

In order to protect the drive and motor, the amount of current applied is limited. This can be specified as the lower of the rated drive or motor current, or some factor thereof (e.g. 80% of the rated drive current and 90% of the rated motor current). The resulting voltage required to regulate that current is typically relatively low compared to the rated motor and drive voltages because the machine impedance is low at dc excitation (only $R_s$) and there is no back-emf at standstill.

As described above, DC trace data may be collected for all phases of the motor 10 (i.e. positive U, negative U, positive V, negative V, positive W and negative W), However, in some embodiments of the invention, DC trace data is obtained for only a subset of those. For example, only three of the vectors may be used such as the positive U, positive V and positive W directions. Indeed, the exemplary currents shown in FIG. 7 are applied to the positive U, positive V and positive W phases only.

As described above, at step 48, the data collected at each instance of the DC trace step 44 is used to determine the stator resistance $R_s$ of the motor 10 and at step 49, the $R_s$ and $U_e$ curves for the motor system are stored.

Figure 8:
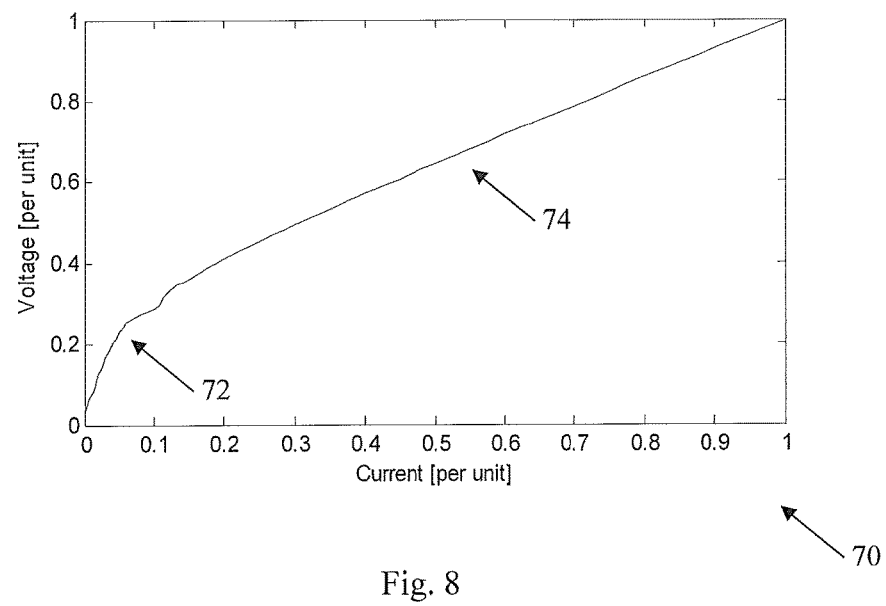
FIG. 8 shows a plot of measured currents and voltages of an exemplary DC sequence.

FIG. 8 shows a plot, indicated generally by the reference numeral 70, of measured currents and voltages as recorded in the algorithm 40. The plot consists of the average of data for 3 traces, one for each phase of the machine in the positive direction. The plot includes a non-linear section (indicated generally by the reference numeral 72) and a linear section (indicated generally by the reference numeral 74). The stator resistance estimate for the motor under test is determined using linear regression of the DC sequence data at higher current levels (i.e. in the linear region) to determine the slope (resistance). The estimation of the stator resistance can also be performed using non-linear regression analysis of the data. For example, the data could be fit to the non-linear function $v_{trace}=v_{drop}(1-e^{-ki_{trace}})+r_s\ i_{trace}$ to determine the parameters $v_{drop}$, k and $r_s$.

As described further in the co-pending application PCT/IB2013/055692 (published as WO2014/024059), the data collected in the DC sequence can be used to generate a $U_e$ curve. The $U_e$ curve is simply the residual remaining after the resistive voltage drop is subtracted from the trace data, i.e. Ue=V(I)−Rhat*I, where Rhat ($\hat{R}$) is the estimated stator resistance determined via the regression analysis.

At this stage, the DC sequence 22 of the algorithm 20 is complete and so the algorithm 20 moves to step 24, where a transient inductance estimation step is carried out in order to determine the transient inductance Lσ. As noted above, FIG. 11 shows an equivalent circuit, indicated generally by the reference numeral 100, for an asynchronous motor, the circuit 100 comprising a stator resistance $R_s$, transient inductance Lσ, main (or magnetizing) inductance $L_h$, and rotor resistance $R_r$. Thus, the step 24 of the algorithm 24 seeks to determine the transient inductance Lσ of the equivalent circuit 100.

Figure 9:
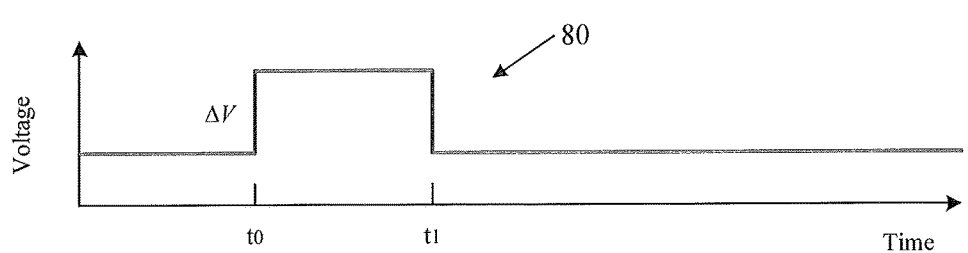
FIG. 9 shows a voltage pulse applied in an exemplary transient inductance step in accordance with an aspect of the present invention.

As shown in FIG. 9, the transient inductance step involves applying a voltage pulse 80 to the machine under test. The voltage pulse (having a height ΔV) is applied between the times $t_0$ and $t_1$.

Figure 10:
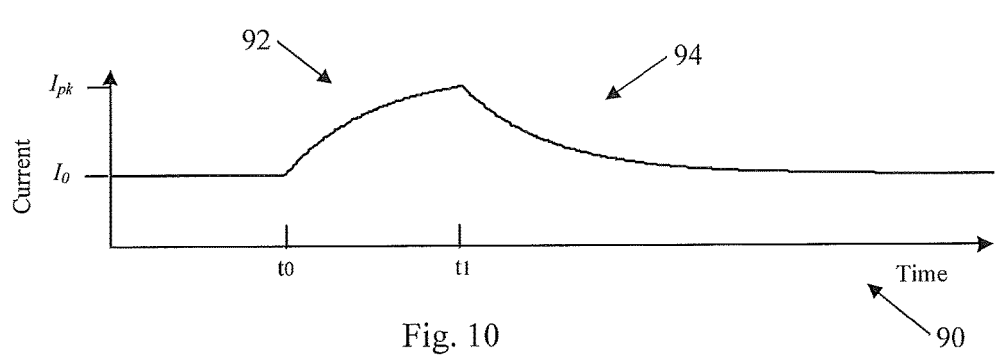
FIG. 10 shows a current pulse generated in response to the voltage pulse of FIG. 9 in an exemplary implementation of the present invention.

As shown in FIG. 10, the application of the voltage pulse 80 results in a current pulse, indicated generally by the reference numeral 90 being generated. At this stage, the voltage pulse is selected to ensure that the current pulse will not be so high as to damage the drive but high enough to get good resolution (e.g. a good signal to noise ratio).

The current pulse 90 has a rising portion 92 and a falling portion 94. The rising portion occurs between times $t_0$ and $t_1$ (when the voltage pulse is being applied) and the falling portion applied from $t_1$ onwards.

The rising portion is non-linear and, in order to measure the non-linear portion, several samples (perhaps of the order of 10 or 20, although more or fewer samples could be taken in alternatives embodiments of the invention) of the current pulse 92 are taken. As described further below, a nonlinear least squares estimation algorithm can be used to estimate the resistance and inductance based on the current response. In one embodiment of the invention, the well-known Levenberg-Marquardt algorithm is used.

The data obtained at this stage is used to adjust the current pulse magnitude (applied voltage pulse) to attain a certain peak, at which the final inductance estimate is recorded. This typically involves applying a larger voltage pulse, which generates a larger current pulse and improves the sensitivity (and accuracy) of the measurements taken.

The current in the rising portion 92 of the current pulse 90 is given by the following formula:

$$i(t) = \frac{v}{R}\left(1 - e^{\frac{-t_0}{\tau}}\right)$$

Where:

$$\tau = \frac{L}{R}$$

$$R = R_S + R_r$$

$$L = L_\sigma$$

By taking several samples, the current equation can be solved to give an indication of the transient inductance ($L\sigma$) and the sum of the stator and rotor resistance ($R_s+R_r$). Note that the two resistances cannot readily be separated (despite $R_s$ being known from the DC sequence) as $R_r$ is highly frequency dependent.

The transient inductance estimate algorithm is repeated at different DC offsets in order to capture operating point variation.

The method described above improves drive protection compared with known methods by adjusting the voltage pulse magnitude based on an initial pulse and curve-fit estimate so that the resulting current pulse is within a prescribed range (not too large and not too small).

The method described above is also less sensitive to drive nonlinearities (such as diode voltage drop) than known methods. A previous method uses two points during the current pulse decay (indicated by the reference numeral 94 in FIG. 10) to estimate the time constant and two points during the current pulse rise (92) to then estimate L and R. Since the current is flowing through diodes during the decay, there was an associated diode voltage drop that was compensated by adjusting the commanded voltage during the decay from zero to a small amount equivalent to the estimated diode voltage drop. The present method eliminates this sensitivity. In addition, by basing the on-pulse on a change in voltage ($\Delta V$), the sensitivity to dead-time and IGBT non-linearities is reduced.

At this stage, the DC sequence has been applied (step 22 of the algorithm 20) and the transient inductance step has been carried out (step 24 of the algorithm 20). As shown in FIG. 2, the algorithm 20 now moves to the AC sequence 26.

As noted above, FIG. 11 shows an equivalent circuit, indicated generally by the reference numeral 100, for an asynchronous motor, the equivalent circuit 100 comprising a stator resistance $R_s$, transient inductance $L\sigma$, main (or magnetizing) inductance $L_h'$, and rotor resistance $R_r'$.

The stator resistance $R_s$ is known from the DC sequence (step 22 of the algorithm 20) and the transient inductance $L\sigma$ is known from the transient inductance estimation algorithm (step 24 of the algorithm 24). We now need to determine the main inductance $L_h'$ and the rotor resistance $R_r'$.

Figure 12:
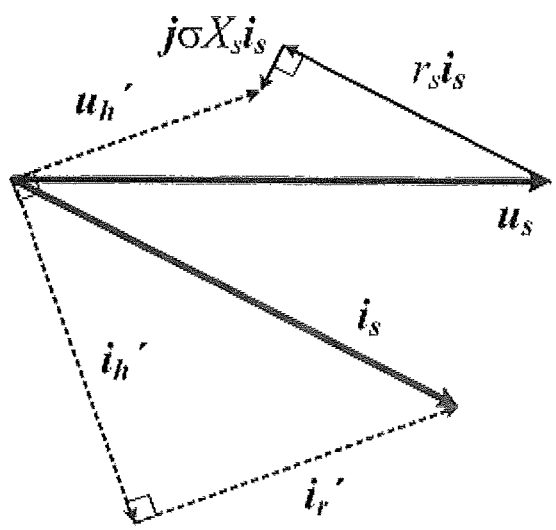
FIG. 12 is a vector diagram in accordance with an aspect of the present invention.

FIG. 12 shows a vector diagram on which the currents and voltages in the machine under test can be plotted. The currents and voltages plotted in FIG. 12 are labelled in the equivalent circuit 100 shown in FIG. 11. As described below, the vector diagram shows how the magnetizing inductance can be determined.

The voltage across the stator $u_s$ (see FIG. 11) is directly measured and plotted (as the x-axis of the vector diagram 110). The stator current $i_s$ (see FIG. 11) is also measured and is plotted on the vector diagram 110. Due to the inductances in the circuit, the stator current and stator voltage are not in phase. The phase difference is represented in the vector diagram by a phase angle between the stator currents and voltages.

As the stator resistance $R_s$ is known from the DC sequence, the voltage drop across the stator resistance (given by $R_s I_s$) can be determined. Further, the voltage drop will be in phase with the stator current and so the angle of the voltage drop can be accurately plotted on the vector diagram 110.

In addition to a voltage drop across the stator resistance $R_s$, a voltage drop will appear across the transient inductance $L\sigma$. The voltage across the transient inductance is given by the following formula:

$$j\sigma X_s i_s$$

Each of the terms of this formula is known. Moreover, this term will be at right-angles to the voltage drop across the resistor $R_s$. Accordingly, the voltage drop across the transient inductance can be plotted on the vector diagram 110.

The only voltage remaining in the circuit is the voltage across the magnetizing inductance $L_h'$ (labelled $U_h'$ in FIG. 11). This voltage can readily be determined from the vector diagram 110.

The voltage $U_h'$ appears across both the magnetizing inductance $L_h'$ and the rotor resistance $R_r'$. We know that the currents through the magnetizing inductance $L_h'$ and the rotor resistance $R_r'$ will be 90 degrees out of phase and it can be seen from the equivalent circuit 100 of FIG. 11 that the current through the magnetizing inductance ($i_h'$) and current through the rotor resistance ($i_r'$) will sum to the stator current $i_s$. Accordingly, those currents can be plotted on the vector diagram 110.

Thus, as show in the vector diagram 110, all of the currents and voltages in the equivalent circuit 100 can be determined. From this, the determination of the magnetizing inductance $L_h'$ and the rotor resistance $R_r'$ is mathematically trivial. It should be noted, however, that although a measurement of the rotor resistance $R_r'$ has been obtained, the rotor resistance is highly frequency dependent and so further analysis of the rotor resistance in often required (as discussed further below).

Figure 13:
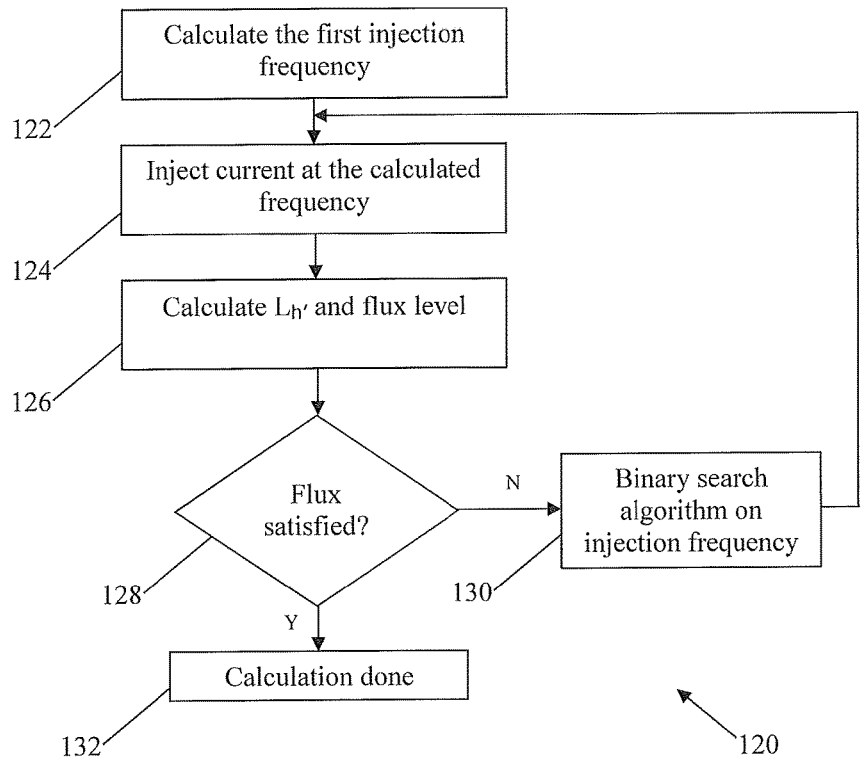
FIG. 13 is a flow chart of a AC sequence in accordance with an aspect of the present invention.

FIG. 13 is a flow chart, indicated generally by the reference numeral 120, of a AC sequence that makes use of the vector diagram principle described above with reference to FIG. 12 to determine the magnetizing inductance $L_h'$ of a motor under test.

The algorithm 120 starts at step 122, where a first injection frequency is calculated on the basis of known or estimated electromagnetic characteristics of the motor. A lookup table function might be used to implement this step.

A constant magnitude current at the first injection frequency is injected at a current based on the rated current of the motor under test (step 124 of the algorithm 120). In one exemplary form of the invention, the current might be injected at 80% of the rated current.

On the basis of the injected current, the magnetizing inductance $L_h'$ is calculated using the methodology described above with reference to FIG. 12. Thus, measurements are taken of the stator voltage $u_s$ and the stator current $i_s$. The stator resistance $R_s$ (known from the DC sequence 22) is used to determine the voltage drop across the stator resistance (given by $R_s I_s$) and the voltage across the transient inductance (known from the transient inductance step 24) is also determined (given by $j\sigma X_s i_s$). As described above, this information, together with knowledge of the phase angle between the stator currents and voltages is sufficient to determine all of the currents and voltages in the equivalent circuit 100, from which the magnetizing inductance $L_h'$ can readily be determined.

With the magnetizing inductance known, the flux in the motor can be estimated, thus completing step 126 of the algorithm 120 (in which both the magnetizing inductance and the flux are determined).

The flux calculated in step 126 is compared to the expected flux which is calculated based on the known (or estimated) electromagnetic characteristics of the motor. At step 128 of the algorithm 120, it is determined whether the calculated flux is sufficiently close to the expected flux. If so, then the measurement for the main inductance $L_h'$ is completed and the algorithm 120 terminates at step 132. Otherwise, the frequency of the injected current is adjusted (step 130 of the algorithm 120) and the algorithm 120 returns to step 124. A search algorithm, such as a binary search algorithm, may be used to implement the step 130; the skilled person will be aware of many suitable algorithms for this step.

The steps 124 to 128 are repeated until the flux calculated in step 126 is sufficiently close to the expected flux.

At this stage, the DC sequence has been applied (step 22 of the algorithm 20), the transient inductance step has been carried out (step 24 of the algorithm 20) and the AC sequence has been applied (step 26 of the algorithm 20). As shown in FIG. 2, the algorithm 20 now moves to the sine wave with offset step 28 in order to determine the rotor resistance.

For the rotor resistance, the algorithm is similar to the described in PCT/IB2013/055692 (published as WO2014/024059), with a DC offset being applied and the injection frequency at the slip frequency. The calculation uses the same vector diagram shown in FIG. 12. FIG. 11 shows that the voltage across $R_r'$ equals to the voltage across $L_h'$ and FIG. 12 shows that (the current through $R_r'$) can be calculated from $i_s$ and $i_h'$. Therefore, the value of $R_r'$ can be obtained.

Figure 14:
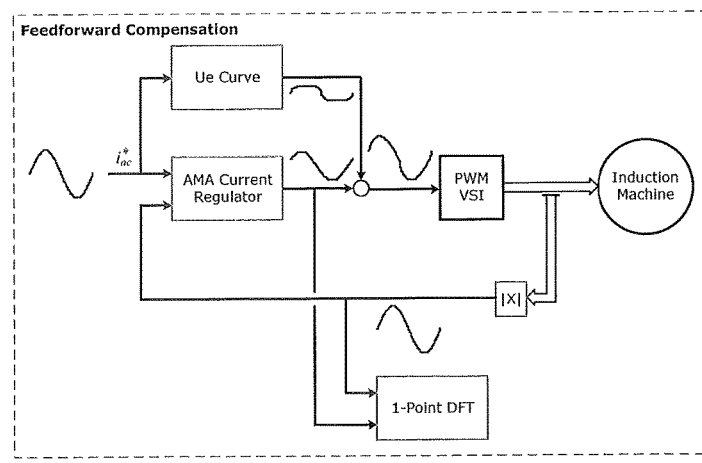
FIG. 14 is a block diagram of a compensation mechanism that may be used when applying an AC sequence in accordance with an aspect of the present invention.
Figure 15:
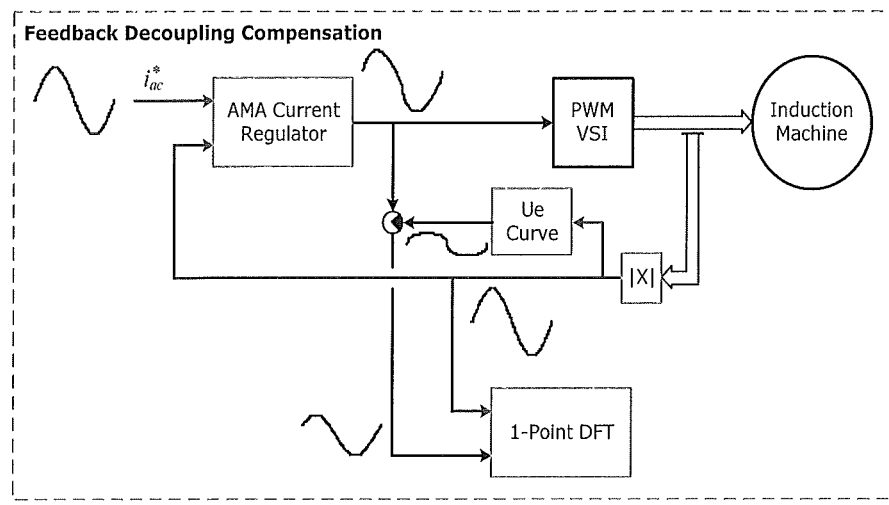
FIG. 15 is a block diagram of an alternative compensation mechanism.
Figure 16:
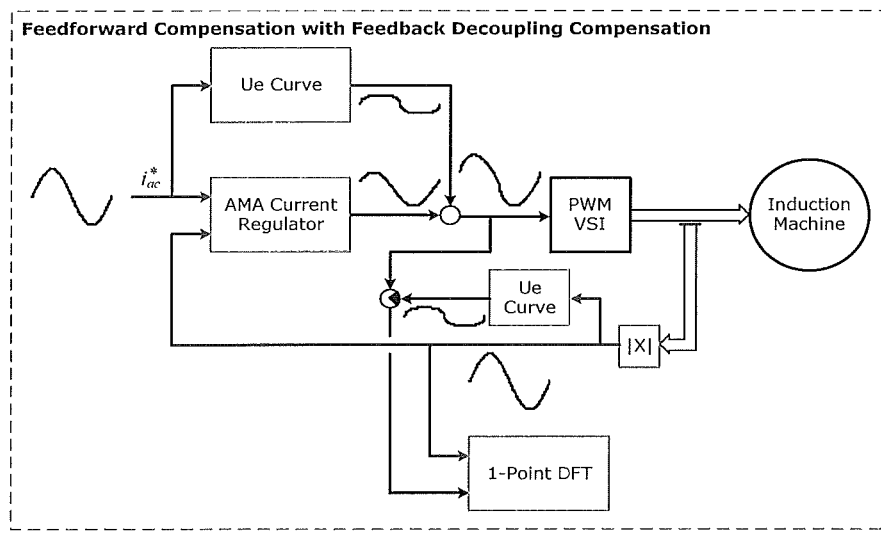
FIG. 16 is a block diagram of a further compensation mechanism.

As described in PCT/IB2013/055692 (published as WO2014/024059), the $U_e$ curve determined in the DC sequence can be used to compensate for the inverter non-linearity in either the command voltage (feedforward compensation—for example as shown in FIG. 14), the feedback voltage used for processing (feedback decoupling compensation—for example as shown in FIG. 15) or a combination thereof (for example as shown in FIG. 16). Of course, many other regulation arrangements other than those shown in FIGS. 14 to 16 could be used.

The embodiments of the invention described above are provided by way of example only. The skilled person will be aware of many modifications, changes and substitutions that could be made without departing from the scope of the present invention. The claims of the present invention are intended to cover all such modifications, changes and substitutions as fall within the spirit and scope of the invention.

What is claimed is:

1. A method of operating an asynchronous motor system based on determined electromagnetic characteristics of the asynchronous motor system, wherein the electromagnetic characteristics include a transient inductance, the method comprising:
   determining the electromagnetic characteristics of the asynchronous motor system; and
   controlling, by a controller, the asynchronous motor system based on the determined electromagnetic characteristics;
   wherein the determining the electromagnetic characteristics comprises:
   applying a voltage pulse to the motor system;
   taking a plurality of samples of a rising portion of a current pulse generated in response to the voltage pulse; and
   using a non-linear curve fitting algorithm to determine the transient inductance of the motor system from said samples.

2. The method as claimed in claim 1, wherein the current pulse is approximated by the equation $$\frac{V}{R}\left(1 - e^{\frac{-t_0}{\tau}}\right),$$

wherein $$\tau = \frac{L}{R}$$

and wherein L is the transient inductance.

3. The method as claimed in claim 2, wherein R is the sum of the stator and rotor resistances of the motor system.

4. The method as claimed in claim 1, wherein the curve fitting algorithm is implemented using a Levenberg-Marquardt algorithm.

5. The method as claimed in claim 1, wherein the transient inductance is estimated at a plurality of different DC offset voltages.

6. The method as claimed in claim 1, wherein the electromagnetic characteristics further comprise a magnetizing inductance, the method comprising:
   injecting a signal into the motor at a first frequency;
   determining the magnetizing inductance and flux in the motor at the first frequency;
   comparing the flux at the first frequency with an expected flux;
   adjusting the frequency of the injected current in the event that the flux is not sufficiently close to the expected flux; and
   using the magnetizing inductance measured when the flux is sufficiently close to the expected flux as the magnetizing inductance of the motor system.

7. The method as claimed in claim 6, wherein determining the magnetizing inductance includes determining the voltage drop across the magnetizing inductance by subtracting both the voltage drop across the stator resistance and the voltage across the transient inductance from the stator voltage.

8. The method as claimed in claim 6, wherein determining the magnetizing inductance includes determining the current flowing through the magnetizing inductance on the basis of the stator current and on the basis that the magnetizing current is at right angles to the voltage across the magnetizing inductance.

9. The method as claimed in claim 6, wherein the expected flux is calculated based on the known or estimated electromagnetic characteristics of the motor system.

10. The method as claimed in claim 6, wherein the frequency of the injected current is adjusted using a binary search algorithm.

11. The method as claimed in claim 1, wherein the electromagnetic characteristics of the asynchronous motor system further comprise a stator resistance of the motor and/or non-linearity of an inverter used to drive the motor, the method further comprising a DC sequence comprises applying a first DC sequence to a first phase of the motor system, the first DC sequence comprising:
  setting a first DC current level for application to the motor system and measuring the current(s) and/or the voltage(s) applied to the motor system in response to the setting of the first DC current level;
  adjusting the applied DC current level and measuring the current(s) and/or voltage(s) applied to the motor in response to the adjusted DC current level; and
  repeating the adjusting and measuring step until the first DC sequence is complete.

12. The method as claimed in claim 11, the method further comprising:
  applying a second DC sequence to a second phase of the motor system, the second DC sequence comprising:
  setting a first DC current level for application to the motor system and measuring the current(s) and/or the voltage(s) applied to the motor system in response to the setting of the first DC current level;
  adjusting the applied DC current level and measuring the current(s) and/or voltage(s) applied to the motor in response to the adjusted DC current level; and
  repeating the adjusting and measuring step until the second DC sequence is complete.

13. The method as claimed in claim 11, further comprising using data obtained from the application of the DC sequence to determine stator resistance of the motor and/or non-linearity of an inverter used to drive the motor.

14. The method as claimed in claim 6, wherein the electromagnetic characteristics further comprise a rotor resistance, wherein the voltage across the rotor resistance is equal to the voltage across the magnetising inductance, wherein the rotor resistance is determined by dividing the voltage across the rotor resistance by the current through the rotor resistance.

15. The method as claimed in claim 1, wherein the electromagnetic characteristics further comprise a rotor resistance, the method further comprising injected an AC signal at a slip frequency of the motor under test in order to determine the rotor resistance.

16. The method as claimed in claim 2, wherein the curve fitting algorithm is implemented using a Levenberg-Marquardt algorithm.

17. The method as claimed in claim 3, wherein the curve fitting algorithm is implemented using a Levenberg-Marquardt algorithm.

18. The method as claimed in claim 2, wherein the transient inductance is estimated at a plurality of different DC offset voltages.

19. The method as claimed in claim 3, wherein the transient inductance is estimated at a plurality of different DC offset voltages.

20. The method as claimed in claim 1, wherein the step of applying the voltage pulse to the motor system is achieved by keeping a voltage vector angle applied to the motor system in one direction such that no torque is generated at the motor system.

21. A method of operating an asynchronous motor system based on determined electromagnetic characteristics of the asynchronous motor system, wherein the electromagnetic characteristics include a magnetizing inductance, the method comprising:
  determining the electromagnetic characteristics of the asynchronous motor system; and
  controlling, by a controller, the asynchronous motor system based on the determined electromagnetic characteristics;
  wherein the determining the electromagnetic characteristics comprises:
    injecting a signal into the motor at a first frequency;
    determining the magnetizing inductance and flux in the motor at the first frequency;
    comparing the flux at the first frequency with an expected flux;
    adjusting the frequency of the injected current in the event that the flux is not sufficiently close to the expected flux; and
    using the magnetizing inductance measured when the flux is sufficiently close to the expected flux as the magnetizing inductance of the motor system.

22. The method as claimed in claim 21, wherein the step of injecting a signal into the motor at a first frequency is achieved by keeping a voltage vector angle applied to the motor system in one direction such that no torque is generated at the motor system.

* * * * *